United States Patent
de Bock et al.

(10) Patent No.: US 9,215,520 B2
(45) Date of Patent: Dec. 15, 2015

(54) MULTI-FUNCTION SYNTHETIC JET AND METHOD OF MANUFACTURING SAME

(75) Inventors: Hendrik Pieter Jacobus de Bock, Clifton Park, NY (US); John Anthony Vogel, Charlton, NY (US); Todd Garrett Wetzel, Niskayuna, NY (US)

(73) Assignee: General Electric Company, Schenectady, NY (US)

( * ) Notice: Subject to any disclaimer, the term of this patent is extended or adjusted under 35 U.S.C. 154(b) by 235 days.

(21) Appl. No.: 13/586,260

(22) Filed: Aug. 15, 2012

(65) Prior Publication Data

US 2014/0049970 A1 Feb. 20, 2014

(51) Int. Cl.

| H01L 41/09 | (2006.01) |
| H04R 1/08 | (2006.01) |
| H01L 41/04 | (2006.01) |
| H05K 7/20 | (2006.01) |
| G10K 9/12 | (2006.01) |
| G10K 11/178 | (2006.01) |

(Continued)

(52) U.S. Cl.
CPC .............. *H04R 1/08* (2013.01); *B05B 17/0653* (2013.01); *G10K 9/121* (2013.01); *G10K 11/1788* (2013.01); *H01L 41/042* (2013.01); *H01L 41/094* (2013.01); *H01L 41/0926* (2013.01); *H05K 7/20172* (2013.01); *G10K 2210/3212* (2013.01); *H01L 2924/0002* (2013.01); *H04R 1/403* (2013.01); *H04R 17/00* (2013.01); *Y10T 29/494* (2015.01)

(58) Field of Classification Search
CPC .............. H05K 7/20172; F04B 17/003; H02N 2/0015; H02N 2/008; H01L 41/042; H01L 41/0926; H01L 41/0933; H01L 41/094

USPC .......................................... 310/328, 330, 332
See application file for complete search history.

(56) References Cited

U.S. PATENT DOCUMENTS 7,358,649 B2 4/2008 Scher et al.
7,397,164 B1 7/2008 Ali
(Continued)

FOREIGN PATENT DOCUMENTS

| EP | 1528836 A2 | 5/2005 |
| EP | 2447992 A2 | 5/2012 |
| WO | 2010116322 A1 | 10/2010 |

OTHER PUBLICATIONS

Foroughi, "Development of a Piezo-Actuator Cooling Technology with Applications to Low Power Electronics," International Microelectronics and Packaging Society, 2011, p. 1.

(Continued)

*Primary Examiner* — Derek Rosenau
(74) *Attorney, Agent, or Firm* — Ziolkowski Patent Solutions Group, SC; Jean K. Testa

(57) ABSTRACT

A synthetic jet assembly includes a synthetic jet having a cavity and an opening formed therein. The synthetic jet assembly also includes an actuator element coupled to a second surface of the body to selectively cause displacement of the second surface, and a control unit electrically coupled to the actuator element. The control unit is configured to transmit a multi-frequency drive signal to the actuator element, the multi-frequency drive signal comprising a cooling frequency component and an acoustic frequency component superimposed on the cooling frequency component. The cooling frequency component causes a cooling jet to eject from the opening of the body. The acoustic frequency component produces a desired audible output.

27 Claims, 5 Drawing Sheets

(51) Int. Cl.
  *B05B 17/06* (2006.01)
  *H04R 1/40* (2006.01)
  *H04R 17/00* (2006.01)

(56) References Cited

U.S. PATENT DOCUMENTS

| | | | |
|---|---|---|---|
| 7,642,698 | B2 | 1/2010 | Leija et al. |
| 7,941,231 | B1 | 5/2011 | Dunn |
| 8,063,533 | B2 | 11/2011 | Osano |
| 8,076,822 | B2 | 12/2011 | Ohsawa |
| 2007/0037506 | A1* | 2/2007 | Lee et al. .................... 454/184 |
| 2009/0167109 | A1 | 7/2009 | Tomita et al. |
| 2010/0054973 | A1 | 3/2010 | Arik et al. |
| 2011/0114287 | A1 | 5/2011 | Arik et al. |
| 2013/0133865 | A1* | 5/2013 | Mahalingam et al. ... 165/104.34 |
| 2013/0311176 | A1* | 11/2013 | Brown et al. ................ 704/233 |
| 2014/0002991 | A1* | 1/2014 | Sharma et al. ............... 361/694 |
| 2014/0029272 | A1* | 1/2014 | Mahalingam et al. ....... 362/373 |

OTHER PUBLICATIONS

Williams et al., "Synthetic Jets for Forced Air Cooling of Electronics," Electronics Cooling, May 1, 2007, pp. 1-7.

Black et al., "Heat Transfer Modules for Cooling Electronics Packages," Proceedings, 4th International Symposium on Advanced Packaging Materials, Mar. 15-18, 1998, Braselton, GA, USA, pp. 209-214.

EP Search Report and Written Opinion issued May 21, 2014 in connection with corresponding EP Patent Application No. 13179970.2.

* cited by examiner

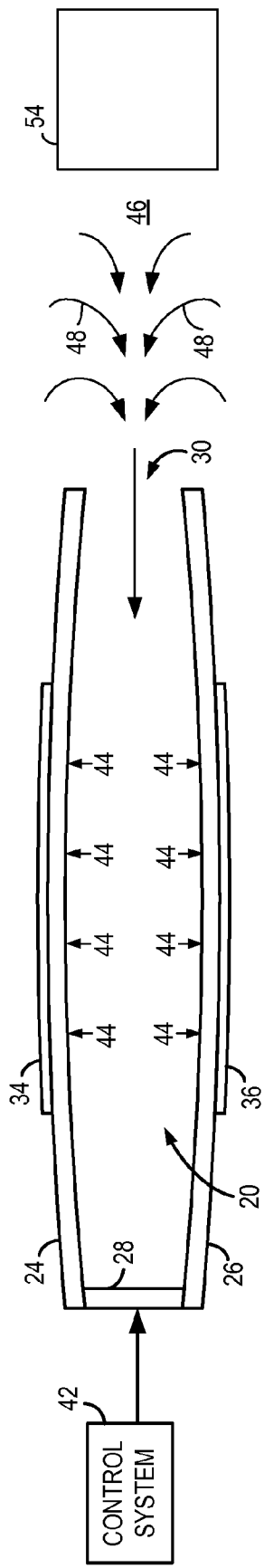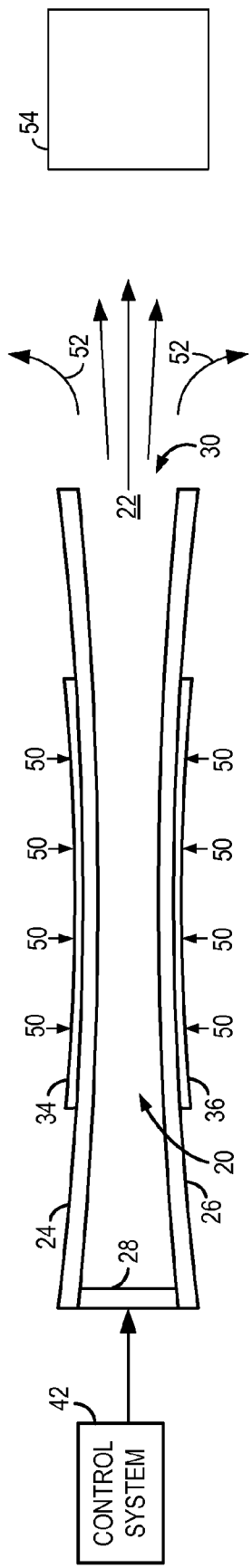

MULTI-FUNCTION SYNTHETIC JET AND METHOD OF MANUFACTURING SAME

BACKGROUND OF THE INVENTION

Embodiments of the invention relate generally to synthetic jets and, more particularly, to multi-function synthetic jets.

Synthetic jet actuators are a widely-used technology that generates a synthetic jet of fluid to influence the flow of that fluid over a surface. A typical synthetic jet actuator comprises a housing defining an internal chamber. An orifice is present in a wall of the housing. The actuator further includes a mechanism in or about the housing for periodically changing the volume within the internal chamber so that a flow is generated and projected in an external environment out from the orifice of the housing. This flow can include fluid vortices. Examples of volume changing mechanisms may include, for example, a piston positioned in the jet housing to move fluid in and out of the orifice during reciprocation of the piston or a flexible diaphragm as a wall of the housing. The flexible diaphragm is typically actuated by a piezoelectric actuator or other appropriate means.

Typically, a system is used to create time-harmonic motion of the volume changing mechanism. As the mechanism decreases the chamber volume, fluid is ejected from the chamber through the orifice. As the fluid passes through the orifice, sharp edges of the orifice separate the flow to create vortex sheets that roll up into vortices. These vortices move away from the edges of the orifice under their own self-induced velocity. As the mechanism increases the chamber volume, ambient fluid is drawn into the chamber from large distances from the orifice. Since the vortices have already moved away from the edges of the orifice, they are not affected by the ambient fluid entering into the chamber. As the vortices travel away from the orifice, they synthesize a jet of fluid, i.e., a "synthetic jet."

To improve the heat transfer path, micro/meso scale devices such as synthetic jets have been proposed as a possible replacement for or augmentation of natural convection in microelectronics devices. Applications may include impingement of a fluid in and around the electronics and printed circuit boards. However, a synthetic jet typically a number of natural frequencies at which the synthetic jet yields superior cooling performance. These natural frequencies include the structural resonant frequency. The structural resonant frequency is caused at the natural frequency of the structure of the synthetic jet, which consists typically of the synthetic jet plates acting as a mass and the elastomeric wall acting as a spring coupled with the air in the synthetic jet volume.

One major use for synthetic jets is in the cooling of heat-producing bodies, which is a concern in many different technologies. As one example, a synthetic jet may be used for thermal management of tight spaces where electronics may be housed and where space for the electronics is a premium. Typically, wireless communication devices such as cellular phones, pagers, two-way radios, and the like, have much of their heat generated in integrated circuit (i.e., IC) packages that are positioned in such tight spaces. Because of the limited space and limited natural convection therein, the heat generated is typically conducted into printed circuit boards and then transferred to the housing interior walls via conduction, convection, and radiative processes. The heat is then typically conducted through the housing walls and to the surrounding ambient environment. The process is typically limited because of the limited opportunity for convection cooling within the housing and over the printed circuit boards. The low thermal conductivity of the fiberglass epoxy resin-based printed circuit boards can lead to high thermal resistance between the heat source and the ambient environment. And, with the advent of smaller enclosures, higher digital clock speeds, greater numbers of power-emitting devices, higher power-density components, and increased expectations for reliability, thermal management issues present an increasing challenge in microelectronics applications.

Typical electronic devices and integrated circuit packages include numerous components to achieve their desired function, such as cooling devices, microphones, speakers, control circuitry, memory devices, and the like. While the use of a synthetic jet over an alternative cooling device, such as an air-cooling fan, saves space within the IC package, advancements in IC packaging are driven by ever-increasing needs for greater miniaturization of electronics packaging and the components therein.

Accordingly, there is a need for a simplified method and apparatus for providing cooling of integrated circuits while minimizing the overall size and complexity of the electronic device.

BRIEF DESCRIPTION OF THE INVENTION

In accordance with one aspect of the invention, a synthetic jet assembly includes a synthetic jet having a cavity and an opening formed therein, an actuator element coupled to a second surface of the body to selectively cause displacement of the second surface, and a control unit electrically coupled to the actuator element. The control unit is configured to transmit a multi-frequency drive signal to the actuator element, the multi-frequency drive signal comprising a cooling frequency component and an acoustic frequency component superimposed on the cooling frequency component. The cooling frequency component causes a cooling jet to eject from the opening of the body. The acoustic frequency component produces a desired audible output.

In accordance with another aspect of the invention, a method of manufacturing a synthetic jet assembly includes providing a synthetic jet body that encircles a volume, forming an orifice in the synthetic jet body to fluidically couple the volume to a gas outside the volume, coupling an actuator element to a flexible surface of the synthetic jet body, and electronically coupling a controller assembly to the actuator element. The controller assembly is programmed to generate a first drive signal comprising an inaudible frequency component that causes a cooling jet to expel from the orifice, generate a second drive signal comprising an audible frequency component that generates a desired acoustic output, combine the first and second drive signals to form a combined drive signal, and transmit the combined drive signal to the actuator element.

In accordance with yet another aspect of the invention, an electronic apparatus includes a synthetic jet including a housing having an orifice formed therein for introducing a fluid from outside the housing into a cavity of the housing and expelling a cooling jet therefrom and a piezoelectric actuator coupled to the housing. The electronic apparatus also includes a drive unit configured to drive the piezoelectric actuator, a control unit configured to transmit a multi-frequency drive signal to the drive unit, and an electronic component configured to be cooled by the cooling jet. The multi-frequency drive signal includes a cooling frequency component selected to generate the cooling jet and a frequency component selected to generate an audible acoustic output.

Various other features and advantages will be made apparent from the following detailed description and the drawings.

BRIEF DESCRIPTION OF THE DRAWINGS

The drawings illustrate embodiments presently contemplated for carrying out the invention.

In the drawings:

FIG. 3 is a cross-section of the synthetic jet of FIG. 2 depicting the jet as the control system causes the diaphragms to travel inward, toward the orifice.

FIG. 4 is a cross-section of the synthetic jet actuator of FIG. 2 depicting the jet as the control system causes the diaphragms to travel outward, away from the orifice.

DETAILED DESCRIPTION OF THE PREFERRED EMBODIMENT

Embodiments of the invention relate to a piezoelectric motive device and methods of making and using a piezoelectric motive device to simultaneously generate a fluid jet and a desired audio output. The operating environment is described herein with respect to a thermal management system for enhancing convection in cooling of electronics. However, it will be appreciated by those skilled in the art that embodiments of the invention are equally applicable for use with other synthetic jet applications. For instance, synthetic jets have been routinely used for stand-point flow control, thrust vectoring of jets, triggering turbulence in boundary layers, and other heat transfer applications. Heat transfer applications may include direct impingement of vortex dipoles on heated surfaces and employing synthetic jets to enhance the performance of existing cooling circuits. Thus, although embodiments of the invention are described with respect to cooling of electronics, they are equally applicable to systems and applications using synthetic jets for other purposes.

Figure 1:
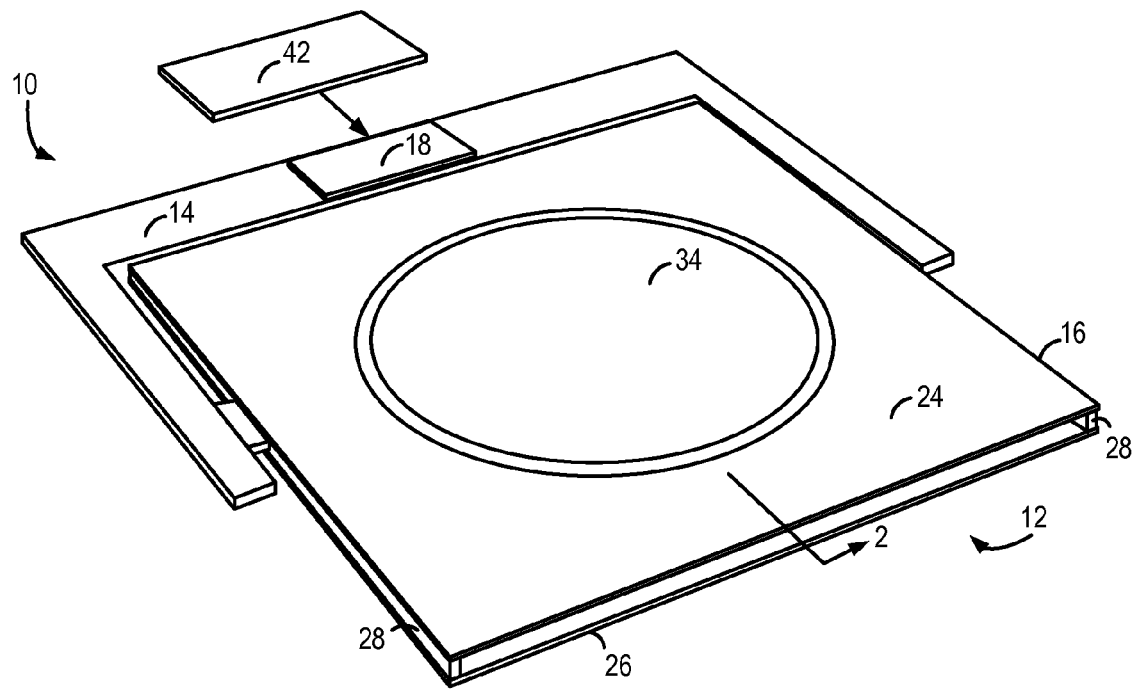
FIG. 1 is a perspective view of a synthetic jet assembly according to an embodiment of the invention.
Figure 2:
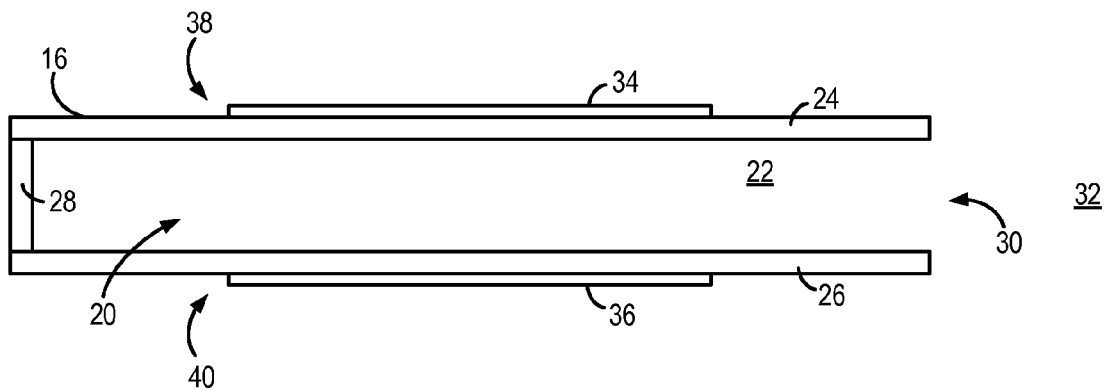
FIG. 2 is a cross-section of a portion of a synthetic jet according to an embodiment of the invention.

Referring to FIG. 1, a perspective view of a synthetic jet assembly 10 is provided. Synthetic jet assembly 10 includes a synthetic jet 12, a cross-section of which is illustrated in FIG. 2, and a mounting device 14. In one embodiment, mounting device 14 is a u-shaped bracket that is affixed to a housing 16 of synthetic jet 12 at one or more locations. A circuit driver 18 can be externally located or affixed to mounting device 14. Alternatively, circuit driver 18 may be remotely located from synthetic jet assembly 10.

Referring now to FIGS. 1 and 2 together, housing 16 of synthetic jet 12 defines and partially encloses an internal chamber or cavity 20 having a gas or fluid 22 therein. While housing 16 and internal chamber 20 can take virtually any geometric configuration according to various embodiments of the invention, for purposes of discussion and understanding, housing 16 is shown in cross-section in FIG. 2 as including a first plate 24 and a second plate 26, which are maintained in a spaced apart relationship by a spacer element 28 positioned therebetween. In one embodiment, spacer element 28 maintains a separation of approximately 1 mm between first and second plates 24, 26. One or more orifices 30 are formed between first and second plates 24, 26 and the side walls of spacer element 28 in order to place the internal chamber 20 in fluid communication with a surrounding, exterior environment 32. In an alternative embodiment, spacer element 28 includes a front surface (not shown) in which one or more orifices 30 are formed.

According to various embodiments, first and second plates 24, 26 may be formed from a metal, plastic, glass, and/or ceramic. Likewise, spacer element 28 may be formed from a metal, plastic, glass, and/or ceramic. Suitable metals include materials such as nickel, aluminum, copper, and molybdenum, or alloys such as stainless steel, brass, bronze, and the like. Suitable polymers and plastics include thermoplastics such as polyolefins, polycarbonate, thermosets, epoxies, urethanes, acrylics, silicones, polyimides, and photoresist-capable materials, and other resilient plastics. Suitable ceramics include, for example, titanates (such as lanthanum titanate, bismuth titanate, and lead zirconate titanate) and molybdates. Furthermore, various other components of synthetic jet 12 may be formed from metal as well.

Actuators 34, 36 are coupled to respective first and second plates, 24, 26 to form first and second composite structures or flexible diaphragms 38, 40, which are controlled by driver 18 via a controller assembly or control unit system 42. As shown in FIG. 1, in one embodiment controller assembly 42 is electronically coupled to driver 18, which is coupled directly to mounting bracket 14 of synthetic jet 12. In an alternative embodiment control unit system 42 is integrated into a driver 18 that is remotely located from synthetic jet 12. For example, each flexible diaphragm 38, 40 may be equipped with a metal layer and a metal electrode may be disposed adjacent to the metal layer so that diaphragms 38, 40 may be moved via an electrical bias imposed between the electrode and the metal layer. Moreover, control system 42 may be configured to generate the electrical bias by any suitable device, such as, for example, a computer, logic processor, or signal generator.

In one embodiment, actuators 34, 36 are piezoelectric motive (piezomotive) devices that may be actuated by application of a harmonic alternating voltage that causes the piezomotive devices to rapidly expand and contract. During operation, control system 42 transmits an electric charge, via driver 18, to piezoelectric actuators 34, 36, which undergo mechanical stress and/or strain responsive to the charge. The stress/strain of piezomotive actuators 34, 36 causes deflection of respective first and second plates 24, 26 such that a time-harmonic or periodic motion is achieved. The resulting volume change in internal chamber 20 causes an interchange of gas or other fluid between internal chamber 20 and exterior volume 32, as described in detail with respect to FIGS. 3 and 4.

Piezomotive actuators 34, 36 may be monomorph or bimorph devices, according to various embodiments of the invention. In a monomorph embodiment, piezomotive actuators 34, 36 may be coupled to plates 24, 26 formed from materials including metal, plastic, glass, or ceramic. In a bimorph embodiment, one or both piezomotive actuators 34, 36 may be bimorph actuators coupled to plates 24, 26 formed from piezoelectric materials. In an alternate embodiment, the bimorph may include single actuators 34, 36, and plates 24, 26 are the second actuators.

The components of synthetic jet 12 may be adhered together or otherwise attached to one another using adhesives, solders, and the like. In one embodiment, a thermoset adhesive or an electrically conductive adhesive is employed to bond actuators 34, 36 to first and second plates, 24, 26 to form first and second composite structures 38, 40. In the case of an electrically conductive adhesive, an adhesive may be filled with an electrically conductive filler such as silver, gold, and the like, in order to attach lead wires (not shown) to synthetic jet 12. Suitable adhesives may have a hardness in the range of Shore A hardness of 100 or less and may include as examples silicones, polyurethanes, thermoplastic rubbers, and the like, such that an operating temperature of 120 degrees or greater may be achieved.

In an embodiment of the invention, actuators 34, 36 may include devices other than piezoelectric motive devices, such as hydraulic, pneumatic, magnetic, electrostatic, and ultrasonic materials. Thus, in such embodiments, control system 42 is configured to activate respective actuators 34, 36 in corresponding fashion. For example, if electrostatic materials are used, control system 42 may be configured to provide a rapidly alternating electrostatic voltage to actuators 34, 36 in order to activate and flex respective first and second plates 24, 26.

The operation of synthetic jet 12 is described with reference to FIGS. 3 and 4. Referring first to FIG. 3, synthetic jet 12 is illustrated as actuators 34, 36 are controlled to cause first and second plates 24, 26 to move outward with respect to internal chamber 20, as depicted by arrows 44. As first and second plates 24, 26 flex outward, the internal volume of internal chamber 20 increases, and ambient fluid or gas 46 rushes into internal chamber 20 as depicted by the set of arrows 48. Actuators 34, 36 are controlled by control system 42 so that when first and second plates 24, 26 move outward from internal chamber 20, vortices are already removed from edges of orifice 30 and thus are not affected by the ambient fluid 46 being drawn into internal chamber 20. Meanwhile, a jet of ambient fluid 46 is synthesized by vortices creating strong entrainment of ambient fluid 46 drawn from large distances away from orifice 30.

FIG. 4 depicts synthetic jet 12 as actuators 34, 36 are controlled to cause first and second plates 24, 26 to flex inward into internal chamber 20, as depicted by arrows 50. The internal volume of internal chamber 20 decreases, and fluid 22 is ejected as a cooling jet through orifice 30 in the direction indicated by the set of arrows 52 toward a device 54 to be cooled, such as, for example a light emitting diode. As the fluid 22 exits internal chamber 20 through orifice 30, the flow separates at the sharp edges of orifice 30 and creates vortex sheets which roll into vortices and begin to move away from edges of orifice 30.

While the synthetic jet of FIGS. 1-4 is shown and described as having a single orifice therein, it is also envisioned that embodiments of the invention may include multiple orifice synthetic jet actuators. Additionally, while the synthetic jet actuators of FIGS. 1-4 are shown and described as having an actuator element included on each of first and second plates, it is also envisioned that embodiments of the invention may include only a single actuator element positioned on one of the plates. Furthermore, it is also envisioned that the synthetic jet plates may be provided in a circular, rectangular, or alternatively shaped configuration, rather than in a square configuration as illustrated herein.

Figure 5:
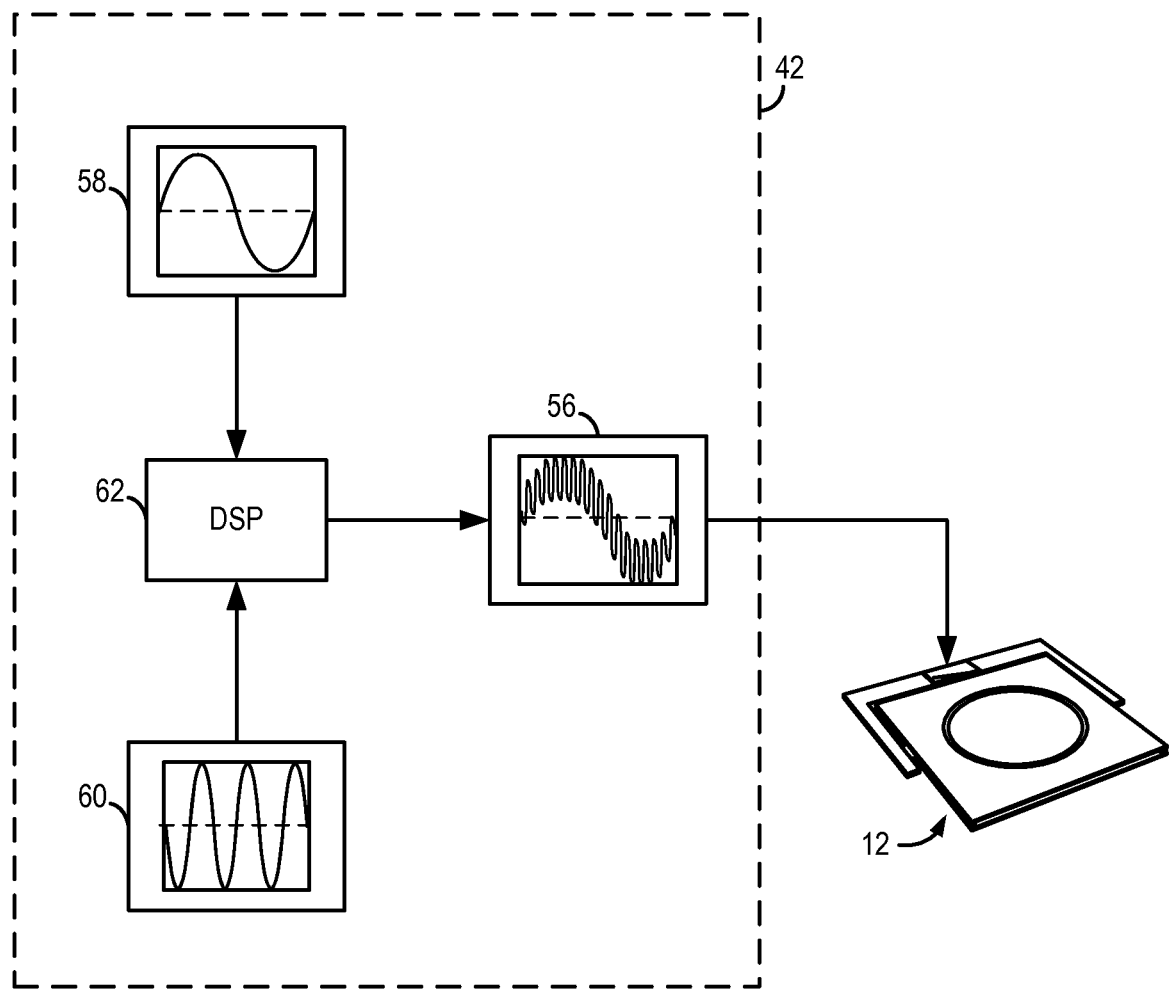
FIG. 5 is a block schematic diagram of a control system and synthetic jet according to an embodiment of the invention.

Referring now to FIG. 5, a block schematic diagram of synthetic jet 12 and control system 42 is provided according to one embodiment of the invention. In operation, control system 42 is programmed to transmit a multi-frequency drive signal 56 to actuators 34, 36 (FIG. 2) of synthetic jet 12. Multi-frequency drive signal 56 is a combined drive signal generated from a combination of a cooling frequency drive signal 58, which is used to generate a cooling jet, and an acoustic frequency drive signal 60, which is used to generate a desired audio output.

Figure 6:
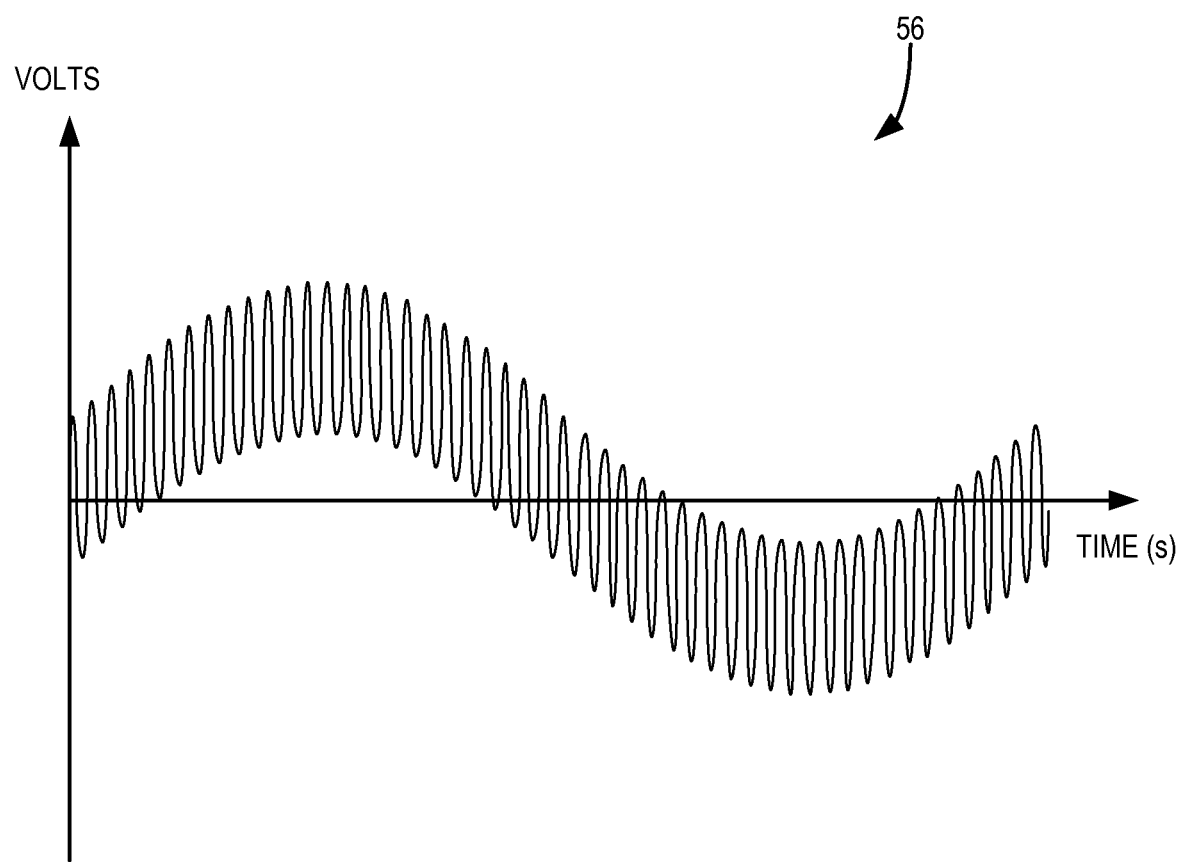
FIG. 6 is a frequency diagram of an exemplary drive signal for the synthetic jet of FIG. 2 according to an embodiment of the invention.

Drive signals 58, 60 are combined by a controller 62 having a digital signal processing (DSP) algorithm stored thereon. Controller 62 receives the cooling and acoustic frequency drive signals 58, 60 and inputs the signals to the DSP algorithm in order to generate multi-frequency drive signal 56, which has a cooling frequency component from drive signal 58 and an acoustic frequency component from drive signal 60. The cooling frequency component of multi-frequency drive signal 56 causes synthetic jet 12 to expand and contract in a manner that generates a desired jet for cooling purposes. In one embodiment, the cooling frequency component applies an AC voltage to synthetic jet 12 at a frequency that undetectable or virtually undetectable by a human ear, such as, for example, between approximately 10 and 400 hertz or alternatively above 20,000 hertz. The acoustic frequency component of multi-frequency drive signal 56 causes synthetic jet 12 to generate an audible acoustic output that is detectable by, for example, a human ear. According to various embodiments, the acoustic frequency component may apply an AC voltage at one or more frequencies between approximately 500 and 20,000 hertz. As shown in detail in FIG. 6, the acoustic frequency component of multi-frequency drive signal 56 is superimposed on the cooling frequency component. Thus, the multi-frequency drive signal 56 generates simultaneous cooling and audible acoustic output.

Referring back to FIG. 5, control system 42 generates a multi-frequency drive signal 56 that drives synthetic jet 12 in one of an audio-output mode or a noise-cancelling mode while maintaining the driving frequency for cooling. As used herein, audio-output mode refers to an operating mode wherein the acoustic frequency component causes synthetic jet 12 to generate a desired audible acoustic output such as, for example, a verbal announcement, an alarm, a server message, or musical output. As used herein, noise-cancelling mode refers to an operating mode wherein the acoustic frequency component causes synthetic jet 12 to generate a desired audible acoustic output that cancels or mitigates an undesired ambient noise condition.

When operating in an audio-output mode, the actuating elements 34, 36 of synthetic jet 12 are driven to generate an acoustic output that can be used for audio applications in devices equipped with synthetic jets for cooling operations. Thus, synthetic jet 12 operates as both a cooling device and speaker. In such an embodiment, in addition to providing active cooling, synthetic jet 12 may be used in any number of applications, including for example, as an alternative to simultaneously function as a speaker in consumer electronic devices such as a cellular telephone, to output an audible alert or serve messages, for building announcements, or to generate ambient music in lighting applications. In audio-output mode the acoustic frequency component may include, for example, one or multiple frequencies in a range of approximately 500-4,000 hertz.

In one embodiment of noise-cancelling mode, control system 42 is pre-programmed with an acoustic anti-noise drive signal 60 corresponding to one or more known tonal frequencies of an undesirable environmental noise or ambient noise condition. For example, the anti-noise drive signal 60 may be selected to cancel audible acoustic noise generated by an engine, fan, or other noise generating apparatus located in the vicinity of synthetic jet 12. In such an embodiment, anti-noise drive signal 60 is produced by phase shifting the ambient noise by generating an anti-noise drive signal 60 is approximately 180 degrees out of phase from the ambient noise, for example. The synthetic jet 12 can simultaneously provide cooling while providing anti-noise.

Figure 7:
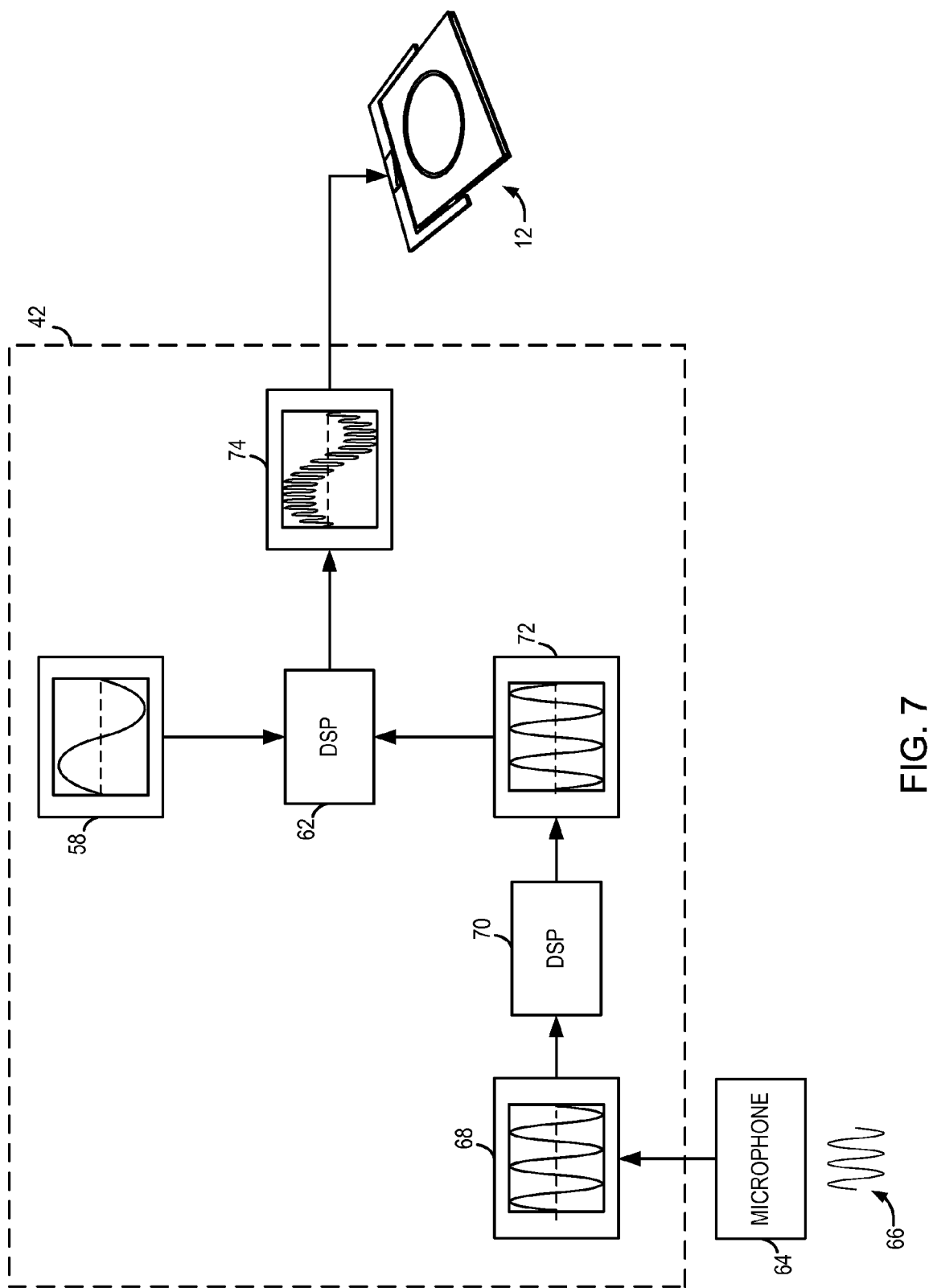
FIG. 7 is a block schematic diagram of a control system and synthetic jet according to another embodiment of the invention.

Referring now to FIG. 7, a block schematic diagram of synthetic jet 12 and control system 42 is illustrated according to of the invention wherein control system 42 is configured to drive synthetic jet 12 in an alternative embodiment of noise-cancelling mode. In such mode, control system 42 drives actuating elements 34, 36 (FIG. 2) of synthetic jet 12 at an acoustic frequency to generate anti-noise using an acoustic drive signal that cancels or mitigates a measured or recorded ambient noise while simultaneously providing cooling, as described in detail below.

One or more sound detection units 64, such as microphones, are used to measure/record the ambient acoustic noise 66. A digital signal 68 corresponding to the measured/recorded noise 66 is output to a controller 70 having a digital signal processing (DSP) algorithm stored thereon. Controller 70 receives the output from microphone(s) 64 and inputs it to the DSP algorithm in order to determine an anti-noise drive signal 72 having a proper frequency and phase at which anti-noise should be generated by synthetic jet 12, such as, for example, one or more frequencies that are shifted approximately 180 degrees out of phase of the detected noise. In one embodiment, the anti-noise drive signal 72 may be determined based on identified frequencies above or below a pre-defined threshold. Further, the anti-noise drive signal 72 may used to effectively shift one or more tonal frequencies or a given frequency spectrum.

In a similar manner as described with respect to FIG. 5, controller 62 then combines a cooling-frequency drive signal 58 for cooling purposes with the anti-noise drive signal 72 to generate a multi-frequency drive signal 74 having a cooling-frequency component corresponding to drive signal 58 and an acoustic-frequency component corresponding to drive signal 72. Actuating elements 34, 36 (FIG. 2) then drive synthetic jet 12 both at a desired cooling frequency and at a frequency corresponding to that of the ambient acoustic noise, but that is out of phase therewith, so as to mitigate or cancel the undesirable ambient noise. Thus, by controller operation of synthetic jet 12 by way of the DSP algorithms of controllers 62, 70, synthetic jet 12 is able to actively generate anti-noise at a plurality of different tonal frequencies while maintaining active cooling.

While the waveforms of the various drive signals described herein are illustrated as sine waves, it should be appreciated that the drive signals are not to be limited to any specific waveform and may be provided as a sine wave, a square wave, a triangular wave, or any other suitable waveform.

Therefore, according to one embodiment of the invention, a synthetic jet assembly includes a synthetic jet having a cavity and an opening formed therein, an actuator element coupled to a second surface of the body to selectively cause displacement of the second surface, and a control unit electrically coupled to the actuator element. The control unit is configured to transmit a multi-frequency drive signal to the actuator element, the multi-frequency drive signal comprising a cooling frequency component and an acoustic frequency component superimposed on the cooling frequency component. The cooling frequency component causes a cooling jet to eject from the opening of the body. The acoustic frequency component produces a desired audible output.

According to another embodiment of the invention, a method of manufacturing a synthetic jet assembly includes providing a synthetic jet body that encircles a volume, forming an orifice in the synthetic jet body to fluidically couple the volume to a gas outside the volume, coupling an actuator element to a flexible surface of the synthetic jet body, and electronically coupling a controller assembly to the actuator element. The controller assembly is programmed to generate a first drive signal comprising an inaudible frequency component that causes a cooling jet to expel from the orifice, generate a second drive signal comprising an audible frequency component that generates a desired acoustic output, combine the first and second drive signals to form a combined drive signal, and transmit the combined drive signal to the actuator element.

According to yet another embodiment of the invention, an electronic apparatus includes a synthetic jet including a housing having an orifice formed therein for introducing a fluid from outside the housing into a cavity of the housing and expelling a cooling jet therefrom and a piezoelectric actuator coupled to the housing. The electronic apparatus also includes a drive unit configured to drive the piezoelectric actuator, a control unit configured to transmit a multi-frequency drive signal to the drive unit, and an electronic component configured to be cooled by the cooling jet. The multi-frequency drive signal includes a cooling frequency component selected to generate the cooling jet and a frequency component selected to generate an audible acoustic output.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A synthetic jet assembly comprising:
a synthetic jet comprising:
a body having a cavity and an opening formed therein;
an actuator element coupled to a second surface of the body to selectively cause displacement of the second surface; and
a control unit electrically coupled to the actuator element and at least two frequency inputs, the control unit configured to transmit a multi-frequency drive signal to the actuator element, the multi-frequency drive signal comprising a cooling frequency component and an acoustic frequency component superimposed on the cooling frequency component.

2. The synthetic jet assembly of claim 1 wherein the cooling frequency component comprises a frequency that is undetectable by a human ear.

3. The synthetic jet assembly of claim 1 wherein the cooling frequency component is less than approximately 400 Hz.

4. The synthetic jet assembly of claim 1 wherein the cooling frequency component is greater than approximately 20,000 Hz.

5. The synthetic jet assembly of claim 1 wherein the acoustic frequency component comprises at least one frequency in a range of approximately 500-20,000 Hz.

6. The synthetic jet assembly of claim 1 wherein the acoustic frequency component generates an audible alert.

7. The synthetic jet assembly of claim 1 wherein the acoustic frequency component generates a verbal message.

8. The synthetic jet assembly of claim 1 wherein the acoustic frequency component is approximately 180 degrees out of phase of a frequency of a known ambient noise condition.

9. The synthetic jet assembly of claim 1 wherein the control unit is further configured to:
- receive an output from a microphone indicative of an ambient noise condition;
- apply a digital signal processing (DSP) algorithm to determine a noise-cancelling frequency, the noise-cancelling frequency having a frequency and phase configured to cancel the ambient noise condition; and
- transmit the acoustic frequency component of the multi-frequency drive signal at the noise-cancelling frequency.

10. The synthetic jet assembly of claim 1 wherein the body of the synthetic jet comprises at least one flexible plate; and
wherein the actuator element is coupled to the at least one flexible plate.

11. The synthetic jet assembly of claim 10 wherein the body of the synthetic jet comprises:
- a first flexible plate coupled to a first side of a spacer element; and
- a second flexible plate coupled to a second side of the spacer element.

12. The synthetic jet assembly of claim 1 wherein the control unit is programmed to:
- receive a cooling frequency drive signal via a first frequency input;
- receive an acoustic frequency drive signal via a second frequency input; and
- generate the multi-frequency drive signal from the cooling frequency drive signal and the acoustic frequency drive signal.

13. The synthetic jet assembly of claim 1 wherein one of the at least two frequency inputs comprises a cooling frequency drive signal; and
wherein another of the at least two frequency inputs comprises an acoustic frequency drive signal.

14. The synthetic jet assembly of claim 13 wherein the cooling frequency drive signal and the acoustic frequency drive signal are input into a digital signal processing (DSP) algorithm stored on the control unit; and
wherein the DSP algorithm generates the multi-frequency drive signal.

15. A method of manufacturing a synthetic jet assembly comprising:
- providing a synthetic jet body that encircles a volume;
- forming an orifice in the synthetic jet body to fluidically couple the volume to a gas outside the volume;
- coupling an actuator element to a flexible surface of the synthetic jet body; and
- electronically coupling a controller assembly to the actuator element, wherein the controller is programmed to:
  - receive a first drive signal;
  - receive a second drive signal;
  - combine the first and second drive signals to form a combined drive signal comprising an inaudible frequency component and an audible frequency component; and
  - transmit the combined drive signal to the actuator element.

16. The method of claim 15 further comprising:
- detecting an ambient noise;
- identifying a noise-cancelling frequency to cancel the ambient noise; and
- generating the second drive signal at the noise-cancelling frequency.

17. The method of claim 15 further comprising generating the second drive signal to produce at least one of a server message, and alarm, and a verbal announcement.

18. The method of claim 15 wherein the inaudible frequency component is in a range of a approximately 10-400 Hz.

19. The method of claim 15 wherein the audible frequency component is in a range of approximately 500-4,000 Hz.

20. An electronic apparatus comprising:
a synthetic jet comprising:
- a housing having an orifice formed therein for introducing a fluid from outside the housing into a cavity of the housing and expelling a cooling jet therefrom toward an electronic component to be cooled; and
- a piezoelectric actuator coupled to the housing;
a drive unit configured to drive the piezoelectric actuator;
a control unit that receives a pair of frequency inputs, generates a multi-frequency drive signal from the pair of frequency inputs, and transmits the multi-frequency drive signal to the drive unit;
and
wherein the multi-frequency drive signal comprises a cooling frequency component selected to generate the cooling jet and an acoustic frequency component selected to generate an audible acoustic output.

21. The electronic apparatus of claim 20 wherein the cooling frequency component is less than approximately 400 Hz.

22. The electronic apparatus of claim 20 wherein the acoustic frequency component is greater than approximately 500 Hz.

23. The electronic apparatus of claim 20 wherein the control unit is programmed to operate according to a noise-cancelling mode.

24. The electronic apparatus of claim 20 wherein the control unit is programmed to operate according to an audio-output mode.

25. The electronic apparatus of claim 20 wherein the electronic component comprises a light emitting diode.

26. The electronic apparatus of claim 20 wherein the drive unit is directly coupled to a surface of the synthetic jet.

27. The electronic apparatus of claim 26 wherein the drive unit is coupled directly to a mounting device of the synthetic jet.

* * * * *